(12) United States Patent
Chen

(10) Patent No.: US 12,094,543 B2
(45) Date of Patent: Sep. 17, 2024

(54) MEMORY AND SENSE AMPLIFYING DEVICE THEREOF

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 419 days.

(21) Appl. No.: 17/703,998

(22) Filed: Mar. 25, 2022

(65) Prior Publication Data

US 2023/0307064 A1 Sep. 28, 2023

(51) Int. Cl.
*G11C 16/28* (2006.01)
*G11C 16/24* (2006.01)
*G11C 16/30* (2006.01)

(52) U.S. Cl.
CPC ............ *G11C 16/28* (2013.01); *G11C 16/24* (2013.01); *G11C 16/30* (2013.01)

(58) Field of Classification Search
CPC ......... G11C 16/28; G11C 16/24; G11C 16/30; G11C 7/062; G11C 7/067; G11C 2207/063
See application file for complete search history.

(56) References Cited

U.S. PATENT DOCUMENTS

| | | | |
|---|---|---|---|
| 7,512,026 B2 | 3/2009 | O | |
| 9,378,780 B1 * | 6/2016 | Chang | G11C 7/08 |
| 9,558,836 B2 | 1/2017 | Mui et al. | |
| 10,424,353 B2 | 9/2019 | Lin | |
| 2004/0213063 A1 * | 10/2004 | Park | G11C 7/06 |
| | | | 365/205 |
| 2012/0020170 A1 * | 1/2012 | Nummer | G11C 11/4074 |
| | | | 365/189.07 |
| 2013/0176078 A1 * | 7/2013 | Lee | G11C 7/12 |
| | | | 330/296 |
| 2019/0252006 A1 * | 8/2019 | Mori | G11C 11/4094 |
| 2019/0318790 A1 * | 10/2019 | Tang | G11C 5/145 |

FOREIGN PATENT DOCUMENTS

| | | |
|---|---|---|
| CN | 103247334 | 2/2017 |
| TW | I618074 | 3/2018 |

OTHER PUBLICATIONS

"Office Action of Taiwan Counterpart Application", issued on Jan. 5, 2023, p. 1-p. 6.

* cited by examiner

*Primary Examiner* — Khamdan N. Alrobaie
(74) *Attorney, Agent, or Firm* — JCIPRNET

(57) ABSTRACT

A memory and a sense amplifying device are provided. The sense amplifying device includes a differential amplifier, a first pre-charge circuit, and a control voltage generator. The differential amplifier has a first input terminal and a second input terminal to receive a data signal and a reference signal, respectively. The first pre-charge circuit is coupled to the first input terminal of the differential amplifier. The first pre-charge circuit, based on a power voltage, performs a pre-charge operation on the first input terminal of the differential amplifier according to a pre-charge enable signal and a control voltage. The control voltage generator generates the control voltage according to the power voltage, and the control voltage and the power voltage are in a positive correlation.

19 Claims, 4 Drawing Sheets

MEMORY AND SENSE AMPLIFYING DEVICE THEREOF

BACKGROUND

Technical Field

The disclosure relates to a memory and a sense amplifying device thereof.

Description of Related Art

In the technical field of memory, on an input terminal of a sense amplifying device, a pre-charge circuit is often disposed to perform a pre-charge operation on the input terminal of the sense amplifying device when a read operation is performed on a memory cell, thereby accelerating the subsequent sensing operation of the data signal of the memory cell.

In the prior art, the pre-charge circuit is often provided with a fixed pre-charge time. However, when a power voltage received by the sense amplifying device changes, during the fixed pre-charge time, the pre-charge circuit may cause the voltage of the input terminal of the sense amplifying device to be boosted to different degrees. For example, when the power voltage becomes high, the voltage of the input terminal of the sense amplifying device may be pre-charged to a relatively high voltage value; conversely, when the power voltage becomes low, the voltage of the input terminal of the sense amplifying device may be pre-charged to a relatively low voltage value. The unstable state of the above-mentioned pre-charge operation will cause the memory to be applied with various power voltages, resulting in the phenomenon of sensing data errors, or causing the read speed to vary with the various power voltages.

SUMMARY

The sense amplifying device of the disclosure includes a differential amplifier, a first pre-charge circuit, and a control voltage generator. The differential amplifier has a first input terminal and a second input terminal to receive a data signal and a reference signal, respectively. The first pre-charge circuit is coupled to the first input terminal of the differential amplifier. The first pre-charge circuit, based on a power voltage, performs a pre-charge operation on the first terminal of the differential amplifier according to a pre-charge enable signal and a control voltage. The control voltage generator generates the control voltage according to the power voltage, and the control voltage and the power voltage are in a positive correlation.

The memory of the disclosure includes at least one memory cell and a sense amplifying device. The sense amplifying device is coupled to the memory cell. The sense amplifying device includes a differential amplifier, a first pre-charge circuit, and a control voltage generator. The differential amplifier has a first input terminal and a second input terminal to receive a data signal and a reference signal, respectively. The first pre-charge circuit is coupled to the first input terminal of the differential amplifier. The first pre-charge circuit, based on a power voltage, performs a pre-charge operation on the first input terminal of the differential amplifier according to a pre-charge enable signal and a control voltage. The control voltage generator generates the control voltage according to the power voltage, and the control voltage and the power voltage are in a positive correlation.

Based on the above, the sense amplifying device of the disclosure performs the pre-charge operation on the input terminal of the differential amplifier through the control voltage. Moreover, the control voltage and the power voltage are in a positive correlation. Therefore, during the pre-charge operation of the first pre-charge circuit, the variation of the power voltage may be compensated, and the pre-charge operation is not affected by the variation of the power voltage. Thus, the overall operation of the memory may be independent of the variation of the power voltage.

DESCRIPTION OF THE EMBODIMENTS

Figure 1:
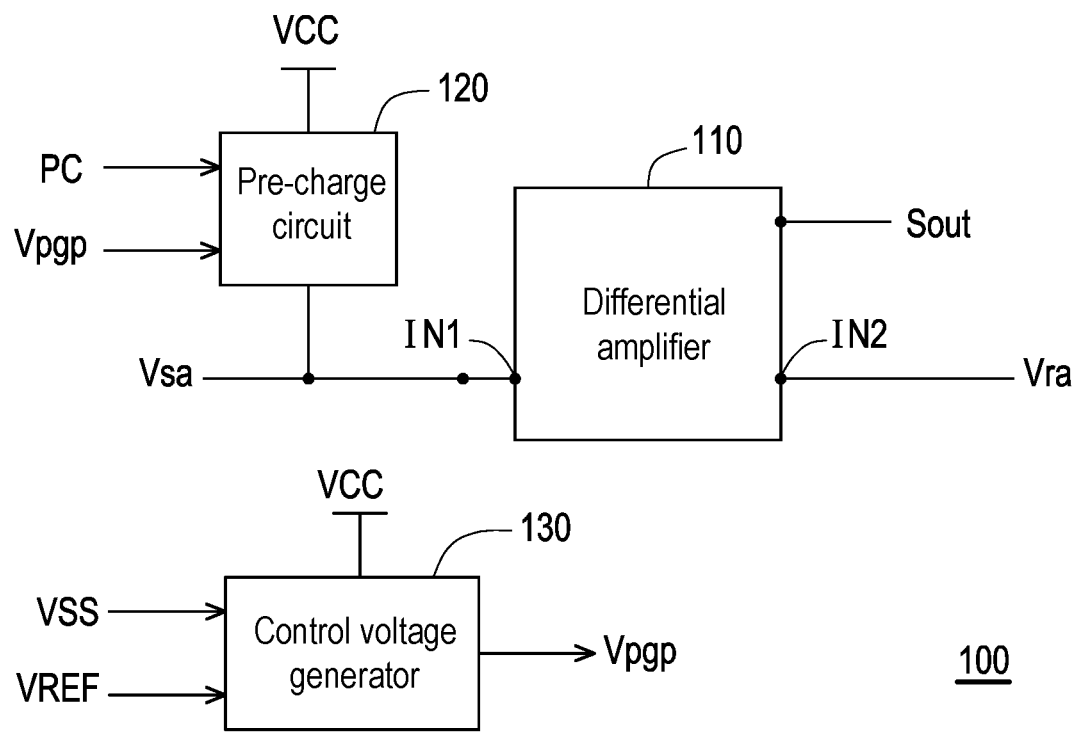
FIG. 1 is a schematic diagram of a sense amplifying device according to an embodiment of the disclosure.

Please refer to FIG. 1, which is a schematic diagram of a sense amplifying device according to an embodiment of the disclosure. A sense amplifying device 100 includes a differential amplifier 110, a pre-charge circuit 120, and a control voltage generator 130. The differential amplifier 110 has input terminals IN1 and IN2. The input terminal IN1 of the differential amplifier 110 is coupled to the pre-charge circuit 120 and receives a data signal. The input terminal IN2 of the differential amplifier 110 receives a reference signal Vra. In the embodiment, the input terminal IN1 of the differential amplifier 110 may be coupled to a selected memory cell, and the selected memory cell is selected to perform a read operation. The selected memory cell may be configured to provide a data signal Vsa to the input terminal IN1 of the differential amplifier 110. During the read operation, the pre-charge circuit 120 performs a pre-charge operation on the input terminal IN1 of the differential amplifier 110 before the data signal Vsa is provided to the input terminal IN1 of the differential amplifier 110.

The differential amplifier 110 is configured to compare the data signal Vsa on the input terminal IN1 and the reference signal Vra on the input terminal IN2, and generate an output signal Sout by amplifying the difference between the data signal Vsa and the reference signal Vra.

In the embodiment, the pre-charge circuit 120, based on a power voltage VCC, may perform the pre-charge operation on the input terminal IN1 according to a pre-charge enable signal PC and a control voltage Vpgp. The control voltage Vpgp is provided by the control voltage generator 130. The control voltage generator 130 generates the control voltage Vpgp according to the power voltage VCC. In one embodiment, the control voltage Vpgp and the power voltage VCC are in a positive correlation.

To further illustrate, the control voltage generator 130 may adjust the voltage value of the control voltage Vpgp according to the voltage value of the power voltage VCC. When the power voltage VCC is less than or equal to a reference value, the voltage value of the control voltage Vpgp may be maintained at a low voltage close to 0 volts. When the power voltage VCC is greater than the above-mentioned reference value, the control voltage Vpgp may be linearly increased in proportion to the power voltage VCC. In the embodiment, when the power voltage VCC is greater than the above-mentioned reference value, the amount of variation of the control voltage Vpgp may be equal to the amount of variation of the power voltage VCC.

As can be seen from the above description, when the power voltage VCC changes, the pre-charge circuit 120 may maintain the pre-charge capability of the input terminal IN1 according to the control voltage Vpgp that changes dynamically with the variation of the power voltage VCC. In this way, no matter how the power voltage VCC changes, the pre-charge operation on the input terminal IN1 of the differential amplifier 110 is constant. The voltage at the input terminal IN1 of the differential amplifier 110 is not insufficiently pre-charged or over pre-charged due to the variation of the power voltage VCC, thereby reducing the possibility that the differential amplifier 110 may generate an erroneous output signal Sout, and effectively maintaining the data sensing rate of the sense amplifying device 100.

Figure 2:
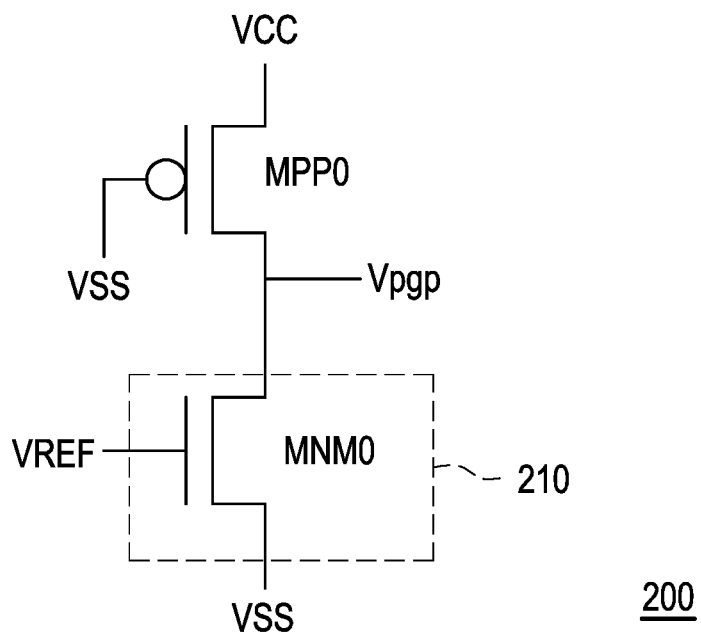
FIG. 2 is a schematic diagram illustrating an embodiment of a control voltage generator in a sense amplifying device according to an embodiment of the disclosure.

Please refer to FIG. 2 for the following. FIG. 2 is a schematic diagram illustrating an embodiment of a control voltage generator in a sense amplifying device according to an embodiment of the disclosure. A control voltage generator 200 includes a transistor MPP0 and a constant current source 210. The first terminal of the transistor MPP0 receives the power voltage VCC; the control terminal of the transistor MPP0 receives a reference voltage VSS; and the second terminal of the transistor MPP0 is coupled to the constant current source 210 and generates the control voltage Vpgp. The constant current source 210 is coupled between the second terminal of the transistor MPP0 and a reference ground terminal, and the reference ground terminal is configured to receive the reference voltage VSS. In the embodiment, the reference voltage VSS may be a ground voltage of 0 volts.

In the embodiment, the constant current source 210 is constructed by a transistor MNM0. The first terminal of the transistor MNM0 is coupled to the second terminal of the transistor MPP0; the control terminal of the transistor MNM0 receives a reference voltage VREF; and the second terminal of the transistor MNM0 receives the reference voltage VSS. The reference voltage VREF may be greater than the reference voltage VSS. In the embodiment, the reference voltage VREF may be, for example, 1.1 volts to 1.2 volts.

The constant current source 210 is configured to draw a fixed current from the second terminal of the transistor MPP0 to the second terminal of the transistor MNM0. When the power voltage VCC is not greater than a turn-on voltage of the transistor MPP0 (equivalent to the reference value), the transistor MPP0 is not turned on, and the control voltage Vpgp at the second terminal of the transistor MPP0 may be pulled down by the constant current source 210 to a very low voltage (e.g., 0 volts). When the power voltage VCC is greater than the turn-on voltage of the transistor MPP0, the transistor MPP0 may be turned on. At this time, a fixed difference may be maintained between the control voltage Vpgp at the second terminal of the transistor MPP0 and the power voltage VCC.

Figure 3:
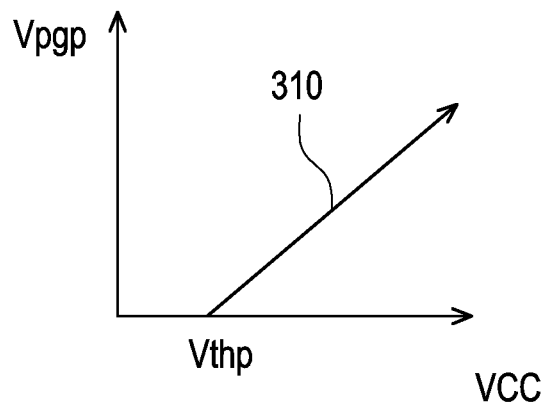
FIG. 3 is a waveform diagram of the embodiment of the control voltage generator 200 in the embodiment of FIG. 2 of the disclosure.

Please refer to FIGS. 2 and 3 at the same time. FIG. 3 is a waveform diagram of the embodiment of the control voltage generator 200 in the embodiment of FIG. 2 of the disclosure. When the power voltage VCC is not greater than a turn-on voltage Vthp of the transistor MPP0, the control voltage Vpgp is substantially equal to 0 volts. When the power voltage VCC is greater than the turn-on voltage Vthp of the transistor MPP0, the control voltage Vpgp may linearly increase with the increase in the power voltage VCC. The slope of the curve 310 of the variation relationship between the control voltage Vpgp and the power voltage VCC may be equal to 1.

Figure 4:
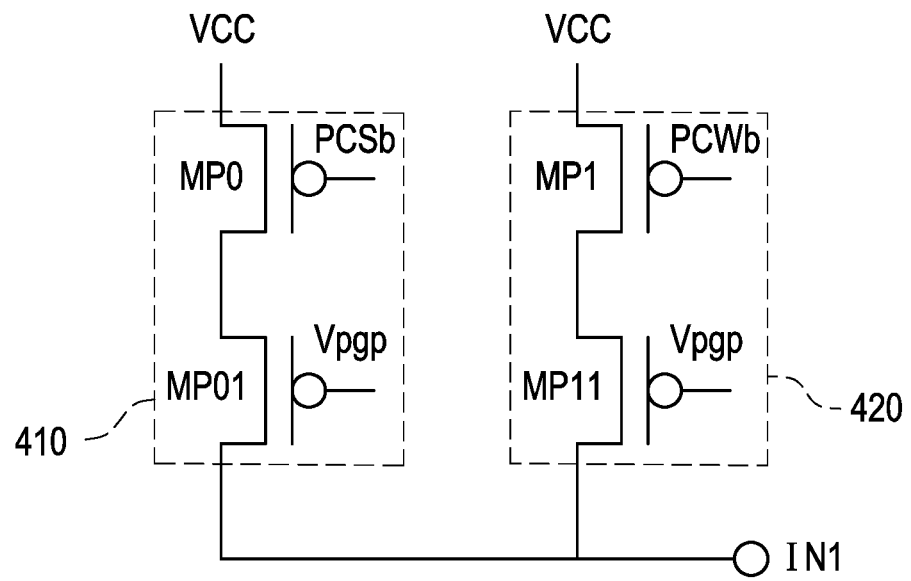
FIG. 4 is a schematic diagram illustrating an embodiment of a pre-charge circuit of a sense amplifying device according to an embodiment of the disclosure.

Next, please refer to FIG. 4. FIG. 4 is a schematic diagram illustrating an embodiment of a pre-charge circuit of a sense amplifying device according to an embodiment of the disclosure. The pre-charge circuit 400 includes pre-charge sub-circuits 410 and 420. The pre-charge sub-circuit 410 includes transistors MP0 and MP01. The pre-charge sub-circuit 420 includes transistors MP1 and MP11. In the embodiment, the first terminal of the transistor MP0 receives the power voltage VCC; the second terminal of the transistor MP0 is coupled to the first terminal of the transistor MP01; and the control terminal of the transistor MP0 receives a pre-charge enable sub-signal PCSb. The control terminal of the transistor MP01 receives the control voltage Vpgp; and the second terminal of the transistor MP01 is coupled to the input terminal IN1 of the differential amplifier.

The first terminal of the transistor MP1 receives the power voltage VCC; the second terminal of the transistor MP1 is coupled to the first terminal of the transistor MP11; and the control terminal of the transistor MP1 receives the pre-charge enable sub-signal PCWb. The control terminal of the transistor MP11 receives the control voltage Vpgp; and the second terminal of the transistor MP11 is coupled to the input terminal IN1 of the differential amplifier.

In the embodiment, the pre-charge sub-circuit 410 and the pre-charge sub-circuit 420 may respectively provide different driving capabilities to pull up the input terminal IN1 to the power voltage VCC to perform the pre-charge operation. The driving capability provided by the pre-charge sub-circuit 410 may be greater than the driving capability provided by the pre-charge sub-circuit 420.

When the pre-charge sub-circuit 410 performs the pre-charge operation, the transistor MP0 may be turned on according to the pre-charge enable sub-signal PCSb. No matter how the power voltage VCC changes, when the power voltage VCC is greater than the reference value, the difference between the power voltage VCC and the control voltage Vpgp may be maintained constant based on the situation where the control voltage Vpgp changes with the variation of the power voltage VCC. Therefore, the driving capability that the pre-charge sub-circuit 410 may provide is fixed.

Similarly, when the pre-charge sub-circuit 420 performs the pre-charge operation, the transistor MP1 may be turned on according to the pre-charge enable sub-signal PCWb. No matter how the power voltage VCC changes, when the power voltage VCC is greater than the reference value, the difference between the power voltage VCC and the control voltage Vpgp may be maintained constant based on the situation where the control voltage Vpgp changes with the variation the power voltage VCC. Therefore, the driving capability that the pre-charge sub-circuit 420 may provide is also fixed.

Incidentally, in the embodiment, the pre-charge sub-circuits 410 and 420 may perform the pre-charge operations at the same time, or may also perform the pre-charge operations in a time-sharing manner, and there is no fixed limitation. In addition, when the power voltage VCC is lower than the above-mentioned reference value, the sense amplifying device of the embodiment of the disclosure does not operate.

Figure 5:
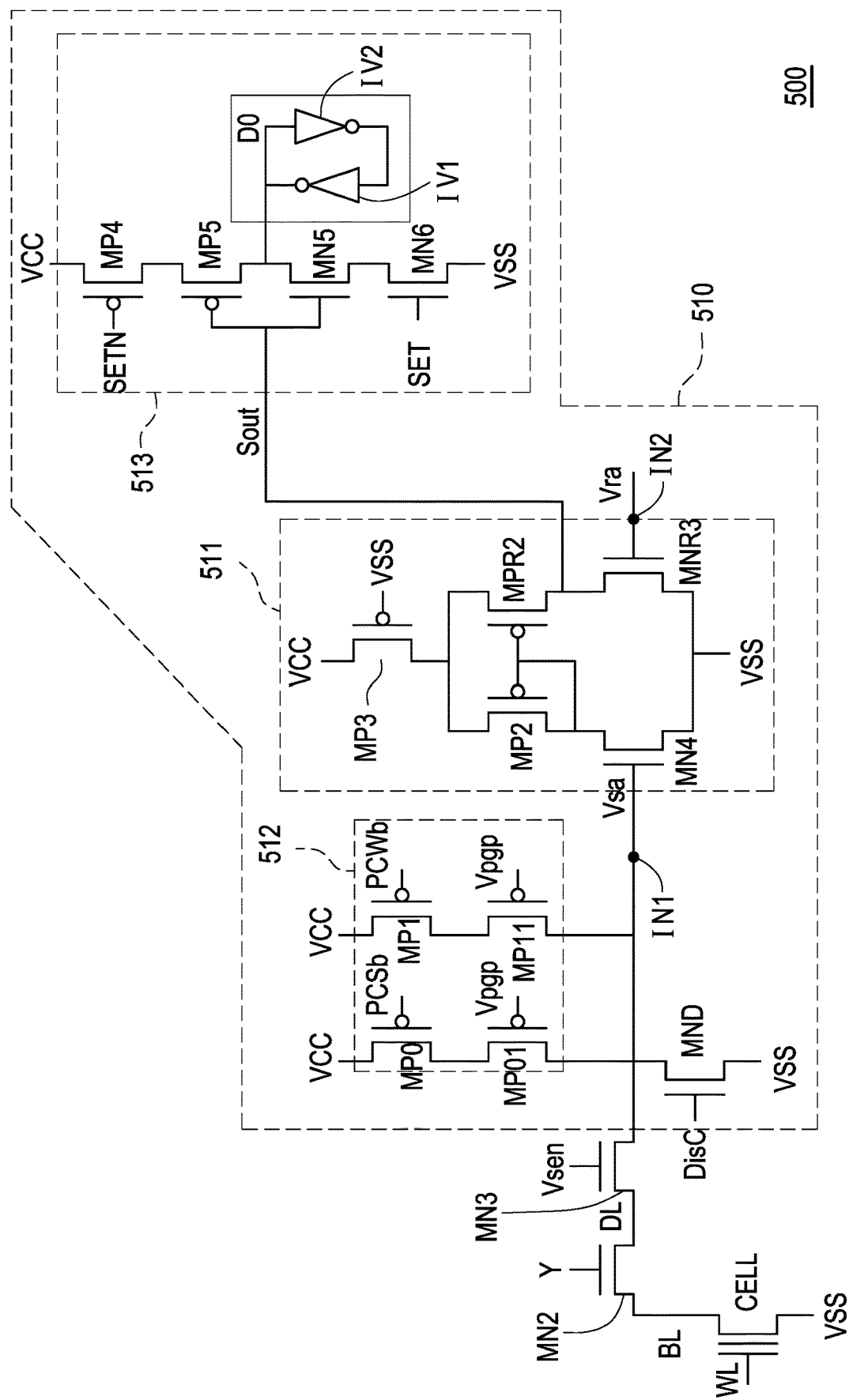
FIG. 5 is a schematic diagram of a memory according to an embodiment of the disclosure.

Please refer to FIG. 5 for the following. FIG. 5 is a schematic diagram of a memory according to an embodiment of the disclosure. The memory 500 includes one or more memory cells CELL and a sense amplifying device 510. The sense amplifying device 510 includes a differential amplifier 511, a pre-charge circuit 512, and a data latch 513. The memory cell CELL may be a selected memory cell, and a bit line BL of the selected memory cell is coupled to a data line DL through a switch constructed by a transistor MN2, and then coupled to the input terminal IN1 of the differential amplifier 511 through a switch constructed by a transistor MN3. When the transistors MN2 and MN3 are turned on according to signals Y and Vsen, respectively, the memory cell CELL provides the data signal Vsa to the input terminal IN1 of the differential amplifier 511 through the bit line BL and the data line DL. The memory cell CELL is controlled by a word line signal WL.

In addition, the pre-charge circuit 512 includes the transistors MP0, MP1, MP01, and MP11. The transistors MP0 and MP01 constitute a pre-charge sub-circuit, and the transistors MP1 and MP11 constitute another pre-charge sub-circuit. The transistors MP0 and MP01 are controlled by the pre-charge enable sub-signal PCSb and the control voltage Vpgp, respectively, the transistors MP1 and MP11 are controlled by the pre-charge enable sub-signal PCWb and the control voltage Vpgp, respectively, and based on the power voltage VCC, a pre-charge operation is performed on the input terminal IN1.

The operation details of the pre-charge circuit 512 are the same as the operation details of the pre-charge circuit 400 in the embodiment of FIG. 4, and are not repeated here. Similar to the pre-charge circuit 400, the pre-charge circuit 512 may be independent of the variation of the power voltage VCC, so as to perform the pre-charge operation on the input terminal IN1 according to a fixed driving capability. In this way, the voltage value of the voltage at the input terminal IN1 boosted during the pre-charge operation may be maintained.

In addition, one terminal of a transistor MND is coupled to the input terminal IN1, and the other terminal of the transistor MND receives the reference voltage VSS. The transistor MND is turned on according to a discharge control signal DisC to discharge the input terminal IN1.

The differential amplifier 511 includes transistors MP3, MP2, MN4, MPR2, and MNR3. The transistors MN4 and MNR3 form a differential input pair, the transistors MP2 and MPR2 are coupled to form an active load, and the transistor MP3 may form a current source.

The other input terminal IN2 of the differential amplifier 511 receives the reference signal Vra. The differential amplifier 511 is configured to amplify the difference between the reference signal Vra and the data signal Vsa to generate the output signal Sout.

In the embodiment, the sense amplifying device 510 further includes the data latch 513. The data latch 513 includes transistors MP4, MP5, MN5, and MN6, and inverters IV1 and IV2. The transistors MP4, MP5, MN5, and MN6 are serially connected between the power voltage VCC and the reference voltage VSS in sequence. The transistor MP4 is controlled by a signal SETN, the transistor MP5 and the transistor MN5 are jointly controlled by the output signal Sout, and the transistor MN6 is controlled by a signal SET. Moreover, the signals SET and SETN are inverted.

When the transistors MP4 and MN6 are turned on, the data latch 513 may transmit the output signal Sout to a latch formed by the inverters IV1 and IV2 through the transistors MP5 and MN5 to obtain sensing data DO.

Based on the situation where the pre-charge circuit 512 may be independent of the variation of the power voltage VCC, a fixed pre-charge driving capability is provided to perform the pre-charge operation on the input terminal IN1 of the differential amplifier. In this way, the memory cell CELL may provide a correct data signal Vsa to the input terminal IN1. Moreover, even under the condition that the power voltage VCC changes, the memory cell 500 may still provide a correct sensing data DO and effectively maintain the data sensing rate of the sense amplifying device 510.

It is worth mentioning that the circuit structures of the differential amplifier 511 and the data latch 513 in the embodiment are only examples for illustration. In other embodiments of the disclosure, differential amplifier circuits and data latch circuits known to those skilled in the art may be applied to the disclosure without specific limitation.

In addition, the memory cell CELL in the embodiment of the disclosure may be a flash memory cell, or a memory cell of any other form, without any fixed limitation.

Figure 6:
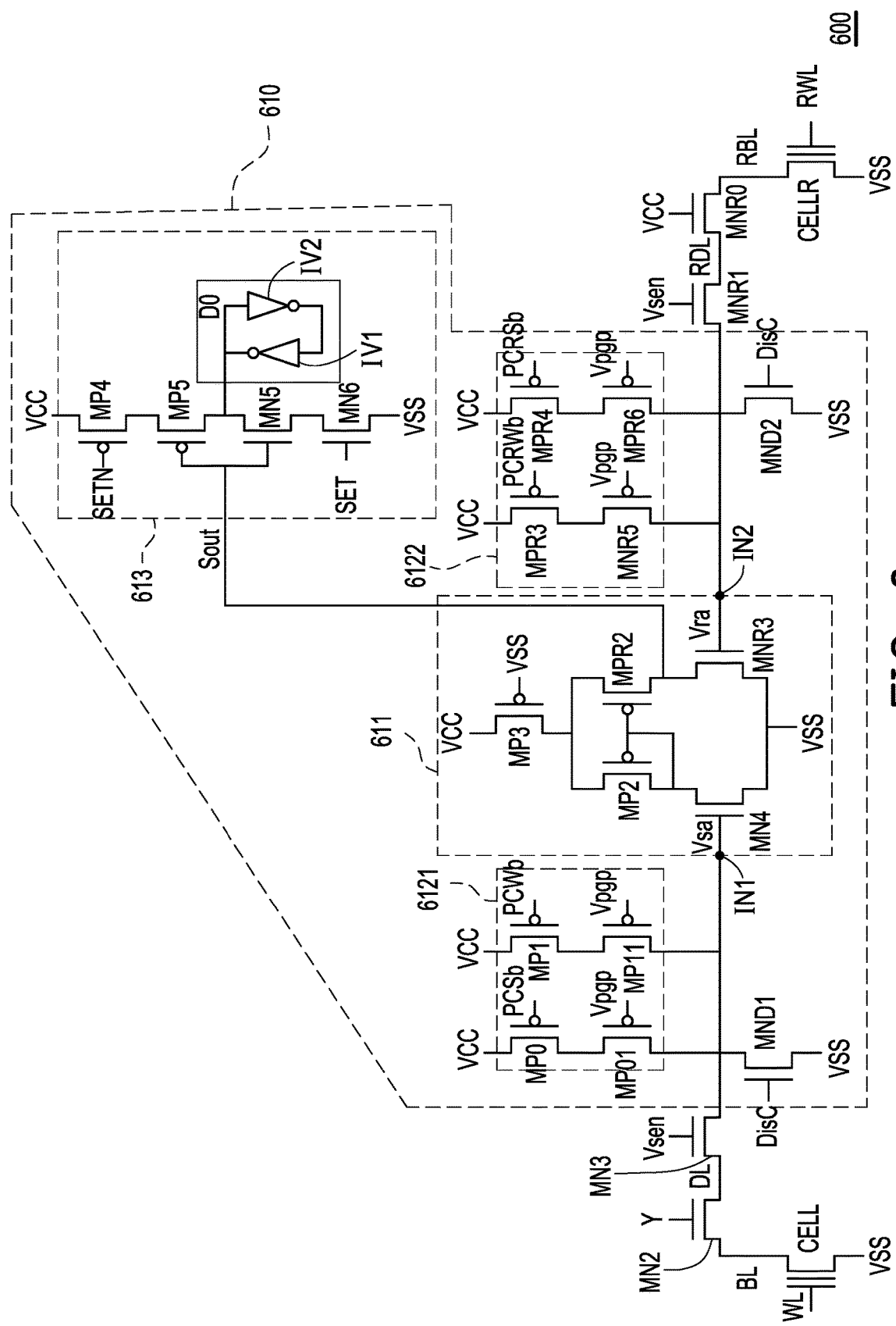
FIG. 6 is a schematic diagram of a memory according to another embodiment of the disclosure.

Please refer to FIG. 6 for the following. FIG. 6 is a schematic diagram of a memory according to another embodiment of the disclosure. A memory 600 includes one or more memory cells CELL, a sense amplifying device 610, and a reference memory cell CELLR. The sense amplifying device 610 includes a differential amplifier 611, a pre-charge circuit 6121, a data latch 613, and a pre-charge circuit 6122. The bit line BL of the memory cell CELL is coupled to the data line DL through the switch constructed by the transistor MN2, and then coupled to the input terminal IN1 of the differential amplifier 611 through the switch constructed by the transistor MN3. When the transistors MN2 and MN3 are turned on according to the signals Y and Vsen, respectively, the memory cell CELL provides the data signal Vsa to the input terminal IN1 of the differential amplifier 611 through the bit line BL and the data line DL.

A bit line RBL of the reference memory cell CELLR is coupled to a reference data line RDL through a switch constructed by a transistor MNR0, and then coupled to the input terminal IN2 of the differential amplifier 611 through a switch constructed by a transistor MNR1. When the transistors MNR0 and MNR1 are turned on according to the power voltage VCC and the signal Vsen, respectively, the reference memory cell CELLR provides the reference signal Vra to the input terminal IN2 of the differential amplifier 611 through the bit line RBL and the reference data line RDL.

In the embodiment, the differential amplifier 611, the pre-charge circuit 6121, and the data latch 613 in the sense amplifying device 610 and the differential amplifier 511, the pre-charge circuit 512, and the data latch 513 in the embodiment of FIG. 5 respectively have the same circuit structures and the same circuit operations, so the descriptions are not repeated here. Unlike the foregoing embodiments, the sense amplifying device 610 further includes the pre-charge circuit 6122 coupled to the input terminal IN2 of the differential amplifier 611. The pre-charge circuit 6122 includes transistors MPR3, MPR4, MNR5, and MPR6. The transistors MPR3 and MNR5 constitute a pre-charge sub-circuit, and the transistors MPR4 and MPR6 constitute another pre-charge sub-circuit. The transistors MPR3 and MNR5 are controlled by a pre-charge enable sub-signal PCRWb and the control voltage Vpgp, respectively, the transistors MPR4 and MPR6 are controlled by the pre-charge enable sub-signal PCRSb and the control voltage Vpgp, respectively, and based on the power voltage VCC, a pre-charge operation is performed on the input terminal IN2.

When the data read operation is performed on the memory cell CELL, the pre-charge circuit 6122 may first perform the pre-charge operation on the input terminal IN2. The operation details of the pre-charge circuit 6122 are the same as the operation details of the pre-charge circuit 400 in the embodiment of FIG. 4, and are not repeated here. Similar to the pre-charge circuit 400, the pre-charge circuit 6122 may be independent of the variation of the power voltage VCC, so as to perform the pre-charge operation on the input terminal IN2 according to the fixed driving capability. In this way, the voltage value of the voltage at the input terminal IN2 boosted during the pre-charge operation may be maintained.

It can be known from the above description that when the memory 600 in the embodiment performs the read operation on the memory cell CELL, the voltages at the two input terminals IN1 and IN2 of the differential amplifier 611 may be pre-charged to fixed voltage values independent of the variation of the power voltage VCC through the pre-charge circuits 6121 and 6122 during the pre-charge operation. In this way, after the pre-charge operation, the memory cell CELL may provide the correct data signal Vsa to the input terminal IN1, and the reference memory cell CELLR may also provide a correct reference signal Vra to the input terminal IN2. Accordingly, the sense amplifying device 610 may immediately and correctly sense recorded data of the memory cell CELL to obtain the correct sensing data DO.

Incidentally, transistors MND1 and MND2 are respectively coupled between the input terminals IN1 and IN2 and the reference voltages VSS, and are configured to turn on the input terminals IN1 and IN2 according to the discharge control signals DisC to discharge the input terminals IN1 and IN2.

In summary, the control voltage generator in the sense amplifying device of the disclosure is configured to provide the control voltage that is in a positive correlation with the variation of the power voltage, and enables the pre-charge circuit to perform the pre-charge operation independent of the power voltage on the input terminal of the differential amplifier according to the fixed difference between the power voltage and the control voltage. In this way, when the power voltage changes, the pre-charge circuit may maintain the voltage value of the voltage at the input terminal of the differential amplifier boosted during the pre-charge operation. In this way, the selected memory cell may correctly provide the data signal to the input terminal of the differential amplifier, so that the sense amplifying device may obtain the sensing data immediately and correctly.

What is claimed is:

1. A sense amplifying device, comprising:
   a differential amplifier, having a first input terminal and a second input terminal to receive a data signal and a reference signal, respectively;
   a first pre-charge circuit, coupled to the first input terminal, and based on a power voltage, performing a pre-charge operation on the first input terminal according to a pre-charge enable signal and a control voltage; and
   a control voltage generator, generating the control voltage according to the power voltage, wherein the control voltage and the power voltage are in a positive correlation.

2. The sense amplifying device according to claim 1, wherein when the power voltage is greater than a reference value, the control voltage generator sets the control voltage to be proportional to the power voltage.

3. The sense amplifying device according to claim 1, wherein the control voltage generator comprises:
   a first transistor, having a first terminal to receive the power voltage, a second terminal of the first transistor generating the control voltage, a control terminal of the first transistor receiving a first reference voltage, and a turn-on voltage value of the first transistor is equal to the reference value; and
   a constant current source, coupled between the second terminal of the first transistor and a reference ground terminal, wherein the reference ground terminal receives the first reference voltage.

4. The sense amplifying device according to claim 3, wherein the constant current source is a second transistor, a first terminal of the second transistor is coupled to the second terminal of the first transistor, a second terminal of the second transistor is coupled to the reference ground terminal, and a control terminal of the second transistor receives a second reference voltage,
   wherein the second reference voltage is greater than the first reference voltage.

5. The sense amplifying device according to claim 1, wherein the first pre-charge circuit comprises:
   a first pre-charge sub-circuit, coupled to the first input terminal, and based on a first driving capability, pulling up the first input terminal to the power voltage according to a first pre-charge enable sub-signal and the control voltage; and
   a second pre-charge sub-circuit, coupled to the first input terminal, and based on a second driving capability, pulling up the first input terminal to the power voltage according to a second pre-charge enable sub-signal and the control voltage,
   wherein the first driving capability is greater than the second driving capability.

6. The sense amplifying device according to claim 5, wherein the first pre-charge sub-circuit comprises:
   a first transistor, having a first terminal to receive the power voltage, and a control terminal of the first transistor receiving the first pre-charge enable sub-signal; and
   a second transistor, having a first terminal coupled to a second terminal of the first transistor, a control terminal of the second transistor receiving the control voltage, and a second terminal of the second transistor coupled to the first input terminal,
   wherein a voltage difference between the first terminal and the control terminal of the second transistor is independent of the power voltage.

7. The sense amplifying device according to claim 6, wherein the second pre-charge sub-circuit comprises:
   a third transistor, having a first terminal to receive the power voltage, and a control terminal of the third transistor receiving the second pre-charge enable sub-signal; and
   a fourth transistor, having a first terminal coupled to a second terminal of the third transistor, a control terminal of the fourth transistor receiving the control voltage, and a second terminal of the fourth transistor coupled to the first input terminal,
   wherein a voltage difference between the first terminal and the control terminal of the fourth transistor is independent of the power voltage.

8. The sense amplifying device according to claim 1, further comprising:

a second pre-charge circuit, coupled to the second input terminal, and based on the power voltage, performing a pre-charge operation on the second input terminal according to the pre-charge enable signal and the control voltage, wherein the second input terminal is configured to be coupled to a reference memory cell, and the reference memory cell is configured to provide the reference signal.

9. The sense amplifying device according to claim 1, wherein the first input terminal is configured to be coupled to a selected memory cell, and a bit line of the selected memory cell provides the data signal.

10. The sense amplifying device according to claim 1, further comprising:
a data latch, coupled to an output terminal of the differential amplifier, and latching an output signal on the output terminal of the differential amplifier to generate a sensing data.

11. A memory, comprising:
at least one memory cell; and
a sense amplifying device, coupled to the at least one memory cell, the sense amplifying device comprising:
    a differential amplifier, having a first input terminal and a second input terminal, wherein the first input terminal is coupled to the at least one memory cell to receive a data signal, and the second input terminal receives a reference signal;
    a first pre-charge circuit, coupled to the first input terminal, and based on a power voltage, performing a pre-charge operation on the first input terminal according to a pre-charge enable signal and a control voltage; and
    a control voltage generator, generating the control voltage according to the power voltage, wherein the control voltage and the power voltage are in a positive correlation.

12. The memory according to claim 11, wherein when the power voltage is greater than a reference value, the control voltage generator sets the control voltage to be proportional to the power voltage.

13. The memory according to claim 11, wherein the control voltage generator comprises:
    a first transistor, having a first terminal to receive the power voltage, a second terminal of the first transistor generating the control voltage, a control terminal of the first transistor receiving a first reference voltage, and a turn-on voltage value of the first transistor is equal to the reference value; and
    a constant current source, coupled between the second terminal of the first transistor and a reference ground terminal, wherein the reference ground terminal receives the first reference voltage.

14. The memory according to claim 13, wherein the constant current source is a second transistor, a first terminal of the second transistor is coupled to the second terminal of the first transistor, a second terminal of the second transistor is coupled to the reference ground terminal, and a control terminal of the second transistor receives a second reference voltage, wherein the second reference voltage is greater than the first reference voltage.

15. The memory according to claim 11, wherein the first pre-charge circuit comprises:
    a first pre-charge sub-circuit, coupled to the first input terminal, and based on a first driving capability, pulling up the first input terminal to the power voltage according to a first pre-charge enable sub-signal and the control voltage; and
    a second pre-charge sub-circuit, coupled to the first input terminal, and based on a second driving capability, pulling up the first input terminal to the power voltage according to a second pre-charge enable sub-signal and the control voltage, wherein the first driving capability is greater than the second driving capability.

16. The memory according to claim 15, wherein the first pre-charge sub-circuit comprises:
    a first transistor, having a first terminal to receive the power voltage, and a control terminal of the first transistor receiving the first pre-charge enable sub-signal; and
    a second transistor, having a first terminal coupled to a second terminal of the first transistor, a control terminal of the second transistor receiving the control voltage, and a second terminal of the second transistor coupled to the first input terminal, wherein a voltage difference between the first terminal and the control terminal of the second transistor is independent of the power voltage.

17. The memory according to claim 16, wherein the second pre-charge sub-circuit comprises:
    a third transistor, having a first terminal to receive the power voltage, and a control terminal of the third transistor receiving the second pre-charge enable sub-signal; and
    a fourth transistor, having a first terminal coupled to a second terminal of the third transistor, a control terminal of the fourth transistor receiving the control voltage, and a second terminal of the fourth transistor coupled to the first input terminal, wherein a voltage difference between the first terminal and the control terminal of the fourth transistor is independent of the power voltage.

18. The memory according to claim 11, further comprising:
    a reference memory cell, coupled to the second input terminal, and the reference memory cell configured to provide the reference signal,
    the sense amplifying device, further comprising:
        a second pre-charge circuit, coupled to the second input terminal, and based on the power voltage, performing a pre-charge operation on the second input terminal according to the pre-charge enable signal and the control voltage.

19. The memory according to claim 11, wherein the sense amplifying device further comprises:
    a data latch, coupled to an output terminal of the differential amplifier, and latching an output signal on the output terminal of the differential amplifier to generate a sensing data.

* * * * *